United States Patent [19]

Tsang

[11] Patent Number: 5,381,424
[45] Date of Patent: Jan. 10, 1995

[54] METHOD AND APPARATUS FOR FAULT-TOLERANT IDENTIFICATION OF THE HEADER FIELD OF A RECORDING DEVICE

[75] Inventor: Kinhing P. Tsang, Plymouth, Minn.

[73] Assignee: Seagate Technology, Inc., Scotts Valley, Calif.

[21] Appl. No.: 36,989

[22] Filed: Mar. 25, 1993

[51] Int. Cl.6 ............................................. G11B 20/18
[52] U.S. Cl. ...................................... 371/40.1; 360/49
[58] Field of Search ............................ 371/37.1–40.4, 371/21.1–21.6, 51.1; 360/49, 53, 72.2; 395/575; 364/262.2, 265–266.6

[56] References Cited

U.S. PATENT DOCUMENTS

| | | | |
|---|---|---|---|
| 4,802,169 | 1/1989 | Suzuki et al. | 371/38 |
| 5,172,380 | 12/1992 | Odaka | 371/37 A |
| 5,237,574 | 8/1993 | Weng | 371/40.1 |

*Primary Examiner*—James Trammell
*Attorney, Agent, or Firm*—Westman, Champlin & Kelly

[57] ABSTRACT

A method and apparatus for fault-tolerant identification of a particular header field of a recording device. Each one of a plurality of headers is a different value encoded into a codeword according to predetermined generator polynominal. A target codeword having a number of symbols is generated. The generated target codeword is identical to a target header codeword. The target header codeword is read to generate a readback codeword having a number of symbols. The target codeword and the readback codeword are compared and the difference between the number of symbols is counted. A not-target-header signal is generated when the difference exceeds a predetermined number corresponding to an error correction capacity of the generator polynominal.

9 Claims, 2 Drawing Sheets

METHOD AND APPARATUS FOR FAULT-TOLERANT IDENTIFICATION OF THE HEADER FIELD OF A RECORDING DEVICE

BACKGROUND OF THE INVENTION

The present invention relates to identification of a particular header field in a magnetic recording device.

In a digital recording system such as a disc drive, data is usually recorded on magnetic discs in the form of sectors. Generally each sector includes a header field where the address and some other format information is recorded, followed by a data field where data information is recorded. In order for a recording device to read or write data information to a particular sector the recording device must first locate the particular sector to be read from or written to. In order to locate the particular sector, the recording device first reads the header field of the sector it is currently accessing and compares that header field with information expected from the header field associated with the target sector (i.e. with the target header).

Recording devices of the prior art also typically use error correction in the reading and writing of both data and header fields. Error correction techniques typically apply a multiple error correcting code, an example of which is the Reed Solomon code. The Reed Solomon code involves the use of redundant data for error correction. If certain redundancy requirements are met, the Reed Solomon code can correct a given number of errors in a data stream for a given amount of redundancy.

Data on a disc is stored in the form of codewords. A codeword is the minimum data unit that is retrieved from the disc. For error correction, each codeword must differ from the next codeword by at least a certain number of bytes. In order to accomplish this, redundant data is added to each codeword to achieve the required minimum difference between codewords. The Reed Solomon code is capable of error correction if the minimum difference between codewords is twice the number of allowable errors plus one. For example, if the minimum difference between codewords is five bytes, the Reed Solomon code is capable of correcting two errors.

Prior methods of error correction involve determining the location and value of errors in order to reconstruct the original data. The complexity of the error correction process increases dramatically as more and more errors per codeword are required to be detected and corrected. Therefore, error correction requires considerable processing, with the processing requirements increasing sharply with increases in the number of errors required to be corrected. This processing requirement demands a compromise. Either a large amount of hardware must be used, a significant amount of processing time must be tolerated, or the system can correct only a smaller number of errors. Therefore, prior methods of error correction for header fields often perform only error checking—determining whether an error exists, without performing any sort of correction if an error does exist. Alternatively, prior methods of error correction for header fields may perform single error correction, correcting no more than one error per codeword.

Recording devices typically use error correction in the reading and writing of data fields. If error correction is important in reading and writing data fields, it is even more important in reading header fields. In a recording device in which no error detection or correction of the header field is used, the header that is received in the readback is compared with the target header to determine if the fields match. If the fields match, it is assumed that the target sector has been found. The read or write operation is then carried out in the data field which follows immediately after the header field. If an uncorrected error occurs in the reading of the header field, data which is intended to be written in one sector is written in another sector. The data which previously existed in the sector that is erroneously written to is destroyed, and the data which is erroneously written to the sector is itself lost.

SUMMARY OF THE INVENTION

The present invention takes advantage of the realization that a lower degree of precision is required in reading header fields than in reading and writing data fields. When a data field is read, the data to be read is unknown. Any error occurring in reading a data field must be corrected exactly, or the data is unusable.

A header field, however, is read in response to a command to read a particular target field. The target field is known, and an exact match need not be achieved between the target field and the value read back from the header field. The only information required is confirmation that the header field that was read was in fact the correct header field. If it can be determined that any discrepancy between the target value and the value actually read back was due solely to errors in the readback, the header field read back is known to be the target field and the discrepancies can be ignored. The precise value of the header field is not needed.

If an error occurs during the reading of the header field, it can be ignored by confirming that the difference between the target value and the readback value is due solely to errors in the readback. In systems using the Reed Solomon code, this is true if the header field actually read back differs from the target field by a lesser degree than it differs from any other header field. For example, in an error correction system capable of correcting errors of two bytes per codeword, header fields have values which differ by five bytes. If the header field read does not exactly match the target header field, then either the read circuit has acquired and read the wrong header field or an error occurred in the readback of the header field. To determine which of these occurred, it is only necessary to determine if the value read back differs from the target header field by two or fewer bytes. If this is true, the header field that was actually read is closer than all other header fields to the expected (or target) value. This is true because if the value read back differs from the value of the target header actually read by two or fewer bytes, the value read back differs from the value of all other header fields by at least three bytes. It is not necessary to reconstruct the header field exactly, as the information contained in the header field is not desired except to confirm that the read operation was performed on the correct location on the disc.

The present invention evaluates errors that occur on the readback of a header field to determine if any mismatch that occurred on the readback is less than or equal to the maximum number of errors that can be corrected. (The maximum number of errors correctable is determined by the level of redundancy employed in setting up the recording device.) If the mismatch is less than the maximum allowable number of errors, the header field that was read was indeed the correct one. The recording device then proceeds to perform the desired operation on the data field.

DETAILED DESCRIPTION OF THE PREFERRED EMBODIMENTS

A. Theory of the Present Invention

Figure 1:
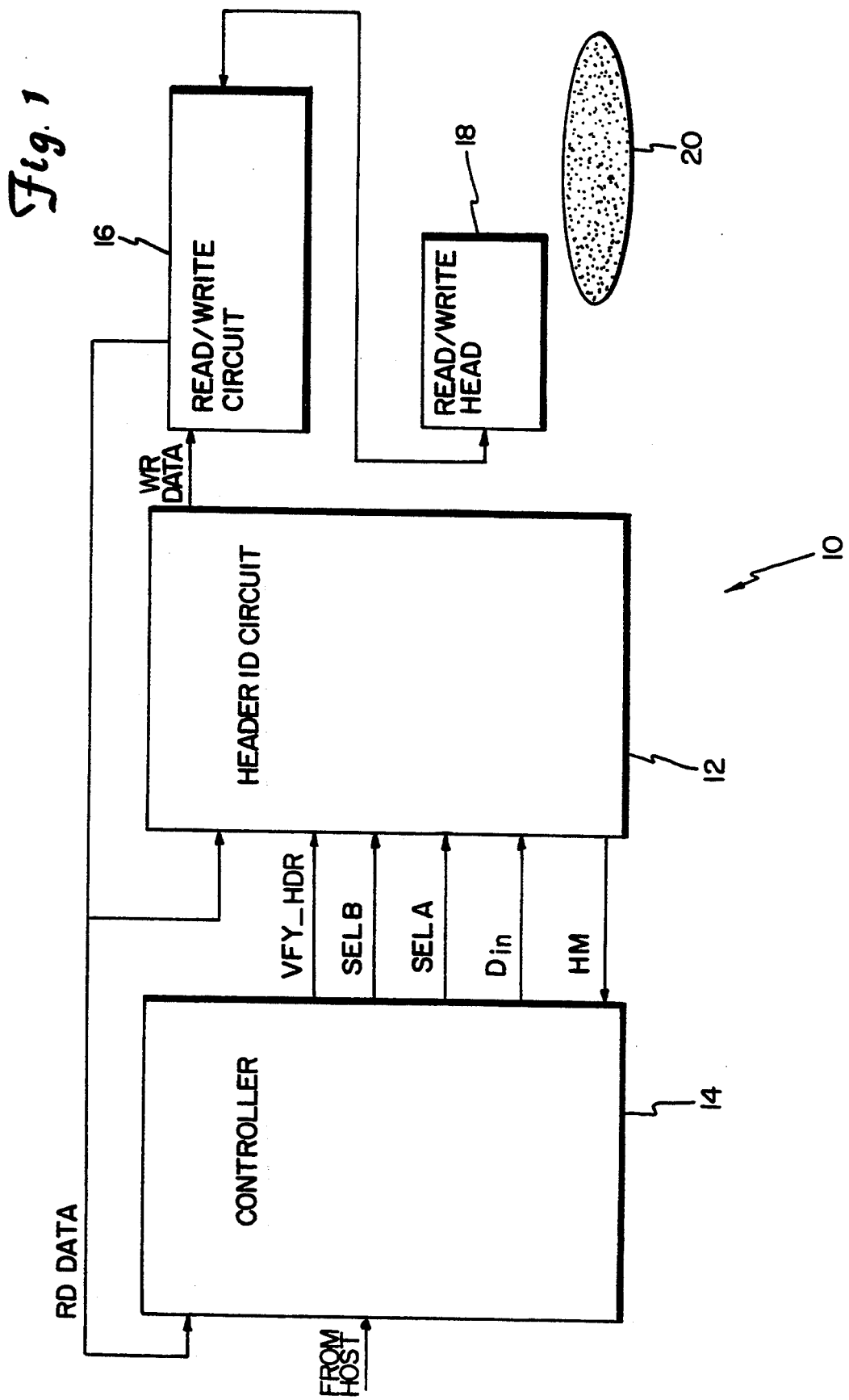
FIG. 1 is a block diagram of a disc drive employing the fault tolerant header identification scheme of the preset invention.

A preferred embodiment of the present invention uses the Reed Solomon error correcting code. Therefore, it is worth setting forth some general comments about the Reed Solomon code and how it relates to the present invention. If each codeword differs from every other codeword by at least d symbols, an erroneous read can be corrected using the Reed Solomon code if there are $(d-1)/2$ or fewer erroneous symbols. So long as there are $(d-1)/2$ or fewer erroneous symbols in a header, the corrupted header will always be closest to its original codeword.

For example, suppose that d is equal to 5. Thus, $(d-1)/2$ is equal to 2. If there are 2 corrupted symbols in a header, the corrupted header differs from its original codeword by 2. If every codeword differs from every other codeword by at least 5, the corrupted header will differ from every codeword except its original codeword by 3. Therefore, to discover whether the correct header field was read, it is necessary merely to check whether there are $(d-1)/2$ or fewer symbols different between the header actually read back and the target codeword. Thus, in order to allow two errors per codeword, it is necessary to have a minimum difference of 5 bytes between codewords. In the case of header field codewords, where the actual value of the target header field codeword is known, the true codeword is known. It is therefore known that the closest codeword to the target value is the true codeword.

The present invention evaluates errors in such a way that it reduces the probability of miscorrection. Instead of only comparing the read back header field with the target header field, it also compares the code syndrome generated by the read back header field and the syndrome generated by the difference between the target header field and the header field actually read back. If only mismatch bytes are considered, a nearby sector with some similar bytes might be mistaken for the target when the number of erroneous bytes exceeds the correction capability. However, when all syndrome bytes are compared, the probability that all syndrome bytes match exactly will be much smaller. The probability of recognizing the wrong sector is thus reduced.

The present invention performs header identification according to the following method. The readback header $R(x)$ (the value that is actually readback) can be expressed as follows:

$$R(x) = C(x) + E(x) \qquad \text{Eq. 1}$$

where, $C(x)$ = Codeword of the readback header as it was written on the disc, and $E(x)$ = Error vector.

If $A(x)$ = Codeword of the target header, then $D(x) = R(x) - A(x)$ = difference between readback header and target header.

Therefore, $$D(x) = C(x) + E(x) - A(x) \qquad \text{Eq. 2}$$

Thus, if $C(x) = A(x)$ then $D(x) = E(x)$. That is to say, if the codeword that is actually read is the target codeword, any difference between the target value and the value readback will be solely due to errors occurring during the read process.

Conversely, if $D(x) = E(x)$ then $C(x) = A(x)$. That is, if any difference between the target value and the value readback is solely due to errors occurring during the readback process, then the codeword read is the target codeword. Obtaining the precise value for $E(x)$ is difficult, and is not required for the identification of a known header field. The same result (i.e. identification of a known header field) can be achieved in a simpler way.

The present invention obtains the error syndromes $S_i$. The error syndromes are as follows:

$$S_i = R(\alpha^i) \qquad \text{Eq. 3}$$

$$S'_i = D(\alpha^i) \qquad \text{Eq. 4}$$

where $\alpha^i$ are the roots of the generator polynomial of the code;

$R(\alpha^i)$ is the remainder of the readback value $R(x)$ when $R(x)$ is divided by each root of the generator polynomial; and $D(\alpha^i)$ is the remainder of the difference signal $D(x)$ when $D(x)$ is divided by each root of the generator polynomial.

When the number of errors that occurred is equal to or less than $(d-1)/2$, then the syndrome $S_i$ is unique for each codeword. That means that differing error syndromes must have resulted from the reading of two different codewords. Therefore, if $S_i$ is equal to $S'_i$ for all i's, then $C(x) = A(x)$ and the target sector has been found. Otherwise, $C(x)$ is not equal to $A(x)$ and the search for the target sector continues.

B. Implementation of the present invention

1. System Overview

FIG. 1 shows a block diagram of a disc drive 10 using the present invention. Disc drive 10 includes fault tolerant header identification circuit 12, controller 14, read/-write circuit 16, recording head 18, and disc 20. Controller 14 is connected to identification circuit 12 and read/write circuit 16. Identification circuit 12 is connected to controller 14 and read/write circuit 16. Read/write circuit 16 is connected to controller 14, identification circuit 12 and recording head 18. Recording head 18 flies above disc 20 as disc 20 spins.

A read or write operation is initiated by a host computer (not shown in FIG. 1), which directs disc drive 10 to read data from or write data to disc 20. Upon receiving a read or write command from the host computer, controller 14 interprets the command and determines a target header which identifies the particular data field on disc 20 which needs to be read from or written to. Controller 14 provides target header signal $D_{in}$ which is representative of the target header, to identification circuit 12. Controller 14 then positions recording head 18 of disc drive 10 over an appropriate track of disc 20 and stores the value of the target header.

As disc 20 spins, header fields sequentially pass beneath recording head 18. As each header field passes beneath recording head 18, recording head 18 produces electrical impulses which are passed to read/write circuit 16. Read/write circuit 16 processes the electrical impulses to produce read data signal RD_DATA which is representative of information stored on disc 20. The portion of read data signal RD_DATA corresponding to the header fields passing beneath read/write head 18 is passed to identification circuit 12, where it is compared with write/target header signal $D_{in}$. Identification circuit 12 produces header mismatch signal HM based on the comparison to indicate whether the correct header field was found. Identification circuit 12 passes header mismatch signal HM to controller 14. Based on the value of header mismatch signal HM, controller 14 directs disc drive 10 to perform the desired operation (e.g. read or write), or else directs disc drive 10 to read the next header field.

Signals SEL A, SEL B, and VFY_HDR are used to control identification circuit 12. The signals will be described in greater detail later in the specification.

Identification circuit 12 receives the target header signal $D_{in}$ from controller 14 and readback header signal RD_DATA from read/write circuit 16. Identification circuit 12 derives the difference between the readback header signal RD_DATA and the target header signal $D_{in}$. Identification circuit 12 evaluates the difference between the readback header signal RD_DATA and the target header signal $D_{in}$ to determine if the difference between the readback header signal and the target header signal is within correctable limits given the particular ECC code being used. Identification circuit 12 determines the error syndrome $S'_i$ of the difference between the target header signal $D_{in}$ and the readback header signal RD_DATA. Identification circuit 12 also determines the error syndrome $S_i$ of the readback header signal RD_DATA. Identification circuit 12 compares these two error syndromes $S_i$ and $S'_i$ to determine if they are identical. If the error syndromes are identical, and if the difference between the target header signal and the readback header signal is within correctable limits, the correct header has been found and controller 14 directs read/write circuit 16 to read from or write to the data field following the header. Otherwise, controller 14 directs read/write circuit 16 to read the next header field.

2. Header Identification Circuit 12 in Detail

Figure 2:
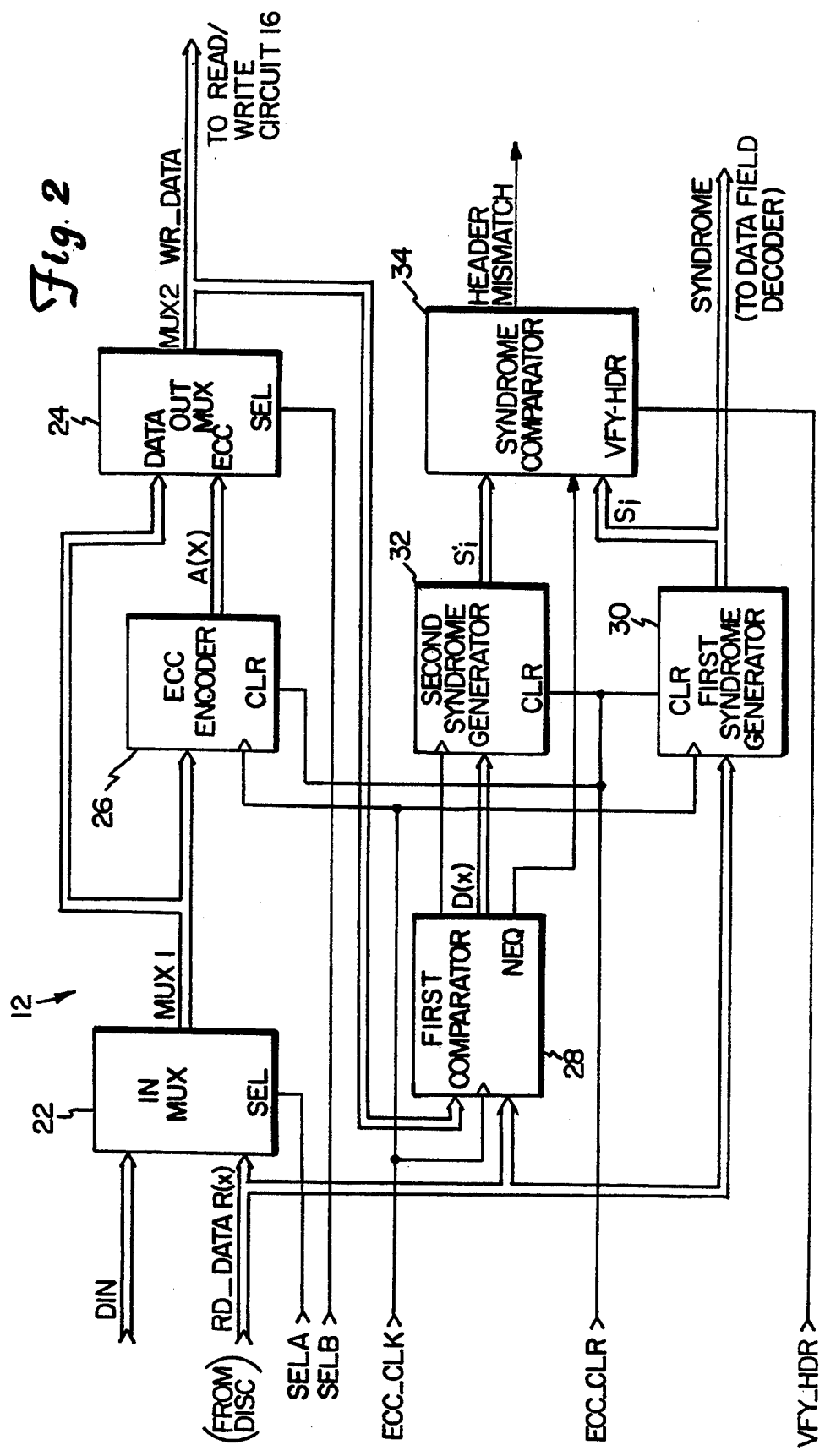
FIG. 2 is a block diagram of the processing system employed to avoid any deleterious effect of errors in the readback of the header field.

FIG. 2 shows header identification circuit 12 in more detail. Identification circuit 12 includes input multiplexer 22, output multiplexer 24, ECC encoder 26, first comparator 28, first syndrome generator 30, second syndrome generator 32, and syndrome comparator 34.

Input multiplexer 22 receives inputs from controller 14 and from read/write circuit 16. Input multiplexer 22 supplies outputs to output multiplexer 24 and ECC encoder 26. Comparator 28 receives inputs from controller 14 and output multiplexer 24. Comparator 28 provides outputs to second syndrome generator 32 and syndrome comparator 34. ECC encoder 26 receives inputs from input multiplexer 22 and controller 14 and supplies an output to output multiplexer 24. Output multiplexer 24 receives inputs from input multiplexer 22, ECC encoder 26, and controller 14 and supplies outputs to read/write circuit 16 and comparator 28. First syndrome generator 30 receives inputs from controller 14 and read/write circuit 16 and supplies outputs to syndrome comparator 34 and read/write circuit 16. Second syndrome comparator 32 receives inputs from controller 14 and comparator 28 and supplies an output to syndrome comparator 34. Syndrome comparator 34 receives inputs from controller 14, first syndrome generator 30, and second syndrome generator 32 and supplies an output to controller 14.

Input multiplexer 22 is used to select whether disc 20 is to be read from or written to. Multiplexer 22 receives write/target header signal $D_{in}$ from controller 14, read data signal RD_DATA from read/write circuit 16, and read/write select signal SEL A from controller 14. Based on the value of read/write select signal SEL A, input multiplexer 22 provides either write/target header signal $D_{in}$ or read data signal RD_DATA at its output as signal MUX 1. If data is to be written to disc 20 or if a header field is to be read, SEL A is set to select write/target header signal $D_{in}$ as MUX 1. If data is to be read from disc 20, SEL A is set to select signal RD_DATA as MUX 1.

Clock signal ECC_CLK and clear signal ECC_CLR from controller 14 are furnished to encoder 26, first comparator 28, first syndrome generator 30, and second syndrome generator 32. Clear signal ECC_CLR is also furnished to syndrome comparator 34. Clear signal ECC_CLR resets all memory elements in identification circuit 12 at the beginning of the read of a header field. Clock signal ECC_CLK provides clocking to identification circuit 12, clocking data through identification circuit 12 one byte at a time.

ECC encoder 26 receives signal MUX 1 from input multiplexer 22 and provides redundant ECC data corresponding to each data unit from signal MUX 1 as it is received. The resulting data stream is provided as encoded data signal A(x) to output multiplexer 24.

Output multiplexer 24 receives, at its inputs, encoded data A(x) from encoder 26 and signal MUX 1. Output multiplexer 24 also receives second select signal SEL B from controller 14. The value of second select signal SEL B toggles, so that the data output MUX 1 and the redundant ECC data are consecutively and alternately provided at the output of MUX 24 as signal MUX 2. In this instance, signal MUX 2 comprises data to be written to disc 20 and therefore comprises the WR_DATA signal which is provided to read/write circuit 16. Signal MUX 2 is also provided to first comparator 28.

First comparator 28 receives signal MUX 2 from output multiplexer 24 and read data signal RD_DATA from read/write circuit 16. First comparator 28 determines the difference between those inputs and supplies the value to second syndrome generator 32 as signal D(x). First comparator 28 determines whether the difference between its inputs is within the error correction capability of header identification circuit 12, based on the ECC code being used. Comparator 28 provides the result of that determination to syndrome comparator 34 as signal NEQ.

First syndrome generator 30, receives read data signal RD_DATA and determines syndrome $S_i$. First syndrome generator 30 supplies syndrome $S_i$ to syndrome comparator 34 and read/write circuit 16.

Second syndrome generator 32 receives signal D(x). Based on signal D(x), second syndrome generator 32 calculates syndrome $S'_i$ and supplies syndrome $S'_i$ to syndrome comparator 34.

Syndrome comparator 34 receives syndrome $S_i$ from first syndrome generator 30, syndrome $S'_i$ from second syndrome generator 32, signal NEQ from comparator 28, and signal VFY_HDR from controller 14. Based on the value of VFY_HDR, syndrome comparator 34 determines whether fault-tolerant header identification is to be performed. If so, syndrome comparator 34 determines whether write/target header signal $D_{in}$ matches readback signal RD_DATA to verify the header field.

3. Reading and Verifying a Header Field

At the beginning of the read of a header field, controller 14 toggles the ECC_CLR signal to clear encoder 26, first syndrome generator 30 and second syndrome generator 32. The VFY_HDR signal is also set to enable operation of syndrome comparator 34, thus allowing verification of header fields. At this point, the write/target header signal $D_{in}$ is received from controller 14 and the RD_DATA signal is received from read/write circuit 16. First select signal SEL A is set to select write/target header signal $D_{in}$ as signal MUX 1. At the same time, signal RD_DATA is supplied to first comparator 28.

A clock pulse stream is then sent as the ECC_CLK signal, clocking first comparator 28, encoder 26, first syndrome generator 30, and second syndrome generator 32. This causes encoder 26 to produce redundant data and supply it to the ECC input of output multiplexer 24. At this point, second select signal SEL B repeatedly toggles so that the output MUX 2 of output multiplexer 24 alternates between the ECC input and the DATA input of output multiplexer 24. This has the effect of adding the appropriate redundancy unit to each data unit passing through output multiplexer 24 to obtain the WR_DATA signal. Thus, the data stream appearing as WR_DATA at the output of output multiplexer 24 contains the same redundancy as data appearing in the header field being read from disc 20.

Signal RD_DATA and signal WR_DATA are simultaneously supplied to the inputs of first comparator 28. At the same time, signal RD_DATA is supplied to first syndrome generator 30. First comparator 28 computes the difference between signal RD_DATA and signal WR_DATA and supplies it as signal D(x) to second syndrome generator 32, first comparator 28 also computes the number of bytes by which signals WR_DATA and RD_DATA differ. If the number of bytes by which signal RD_DATA and WR_DATA differ exceeds the number which can be corrected, it is known that the target header field was not read, the search for the header field continues and the next header field is read from disc 20.

If the difference between signal RD_DATA and signal WR_DATA is less than or equal to the maximum number of bytes correctable by the error correcting system, the system continues its evaluation. Signal RDDATA is supplied to first syndrome generator 30 and signal D(x) is supplied to second syndrome generator 32. First syndrome generator 30 computes the error syndrome $S_i$ for signal RD_DATA and supplies it to syndrome comparator 34.

Syndrome comparator 34 compares first error syndrome $S_i$ and second error syndrome $S'_i$. Syndrome comparator 34 sets the value of header mismatch signal HM according to whether the error syndromes match.

In accordance with the discussion above, read data signal RD_DATA represented by R(x) can be expressed as C(x)+E(x). The value of target header signal $D_{in}$ is operated on by encoder 26 to produce target header codeword A(x). First comparator 28 performs the operation R(x)−A(x), which is equivalent to C(x)+E(x)−A(x), to produce difference signal D(x).

First comparator 28 determines if the number of errors is less than or equal to the number allowed and produces signal NEQ to convey this information to syndrome comparator 34. If NEQ indicates that the number of errors is within the allowable limit, then it can be determined from first error syndrome $S_i$ and second error syndrome $S'_i$ whether the correct header field was read.

First syndrome generator 30 operates on R(x) to produce first error syndrome $S_i$. First error syndrome $S_i$ is the error syndrome of R(x). First error syndrome $S_i$ is equal to $R(\alpha^i)$, and is also equal to $E(\alpha^i)$. Therefore, it is correct to say that $S_i$ is equal to $E(\alpha^i)$, which is the error syndrome of E(x).

Second syndrome generator 32 operates on difference signal D(x) to produce second error syndrome $S'_i = D(\alpha^i)$.

If the number of errors that occurred is within allowable limits then:

$$S_i = S'_i \rightarrow E(x) = D(x) \qquad \text{Eq. 5}$$

If:

$$E(x) = D(x) \rightarrow C(x) = A(x) \qquad \text{Eq. 6}$$

If:

$$C(x) = A(x) \qquad \text{Eq. 7}$$

then the target header has been found.

Therefore, syndrome comparator 34 determines whether first error syndrome $S_i$ and second error syndrome $S'_i$ match, and evaluates signal NEQ to determine if the number of errors is less than or equal to the number of allowable errors. Syndrome comparator 34 provides header mismatch signal HM to controller 14 based on its determination. Based on the value of header mismatch signal HM, controller 14 either directs the disc drive 10 to read or write the data field or else directs disc drive 10 to read the next header field.

C. Conclusion

The present invention is capable of reliably identifying the header field indicating the presence of particular data on a recording device, even if multiple errors occur during the readback, and without the need to perform actual error correction on a header that is incorrectly read back. Even the value of a header field which is read back differs from the target header field, the present invention is able to determine whether the target header field was in fact read back. It does this by determining whether the difference between the target header field and the header field that was read back is less than the difference between the header field that was read back and any other header field.

Although the present invention has been described with reference to preferred embodiments, workers skilled in the art will recognize that changes may be made in form and detail without departing from the spirit and scope of the invention.

What is claimed is:

1. In a magnetic disc drive having a magnetic disc storing information in header fields and corresponding data fields, the information including redundant data so the information in the header fields differs by a predetermined difference, and wherein the magnetic disc drive receives target information from a host computer representative of a target header field corresponding to a data field to be accessed, a method of controlling the disc drive by determining whether a readback header field read from the magnetic disc corresponds to the target header field, the method comprising:

comparing the target information with the information in the readback header field to determine whether the information in the readback header field differs from the target information by an amount within a maximum tolerable range, the maximum tolerable range being a function of tile predetermined difference wherein comparing comprises:
        generating a first syndrome based on the information read from the readback header field;
        generating a second syndrome based on the difference between the target information and the information read back from the readback header field; and
        comparing the first syndrome with the second syndrome;
    causing the magnetic disc drive to access the data field corresponding to the readback header field if the target information and information in the readback header field differs by an amount within the maximum tolerable range; and
    causing the magnetic disc drive to read a subsequent header field if the target information and the information in the readback header field differs by an amount exceeding the maximum tolerable range.

2. The method of claim 1 wherein the maximum tolerable range comprises a maximum number of correctable errors based on the redundant data, and wherein causing the magnetic disc drive to access comprises:
    causing the magnetic disc drive to access the data field corresponding to the readback header field if the first and second syndromes are identical.

3. The method of claim 2 wherein causing the magnetic disc drive to read comprises:
    causing the magnetic disc drive to read the subsequent header field if the target information and the information in the readback header field differs by a number of bytes of information exceeding the maximum number of correctable errors; and
    causing the magnetic disc drive to read the subsequent header field if the first and second syndromes are not identical.

4. A circuit for determining whether a header field on a disc in a magnetic disc drive is a target header identifying a sector on the magnetic disc to be accessed, the circuit comprising:
    readback means for receiving a readback header value from the disc;
    target means for receiving a target header value from a host computer, the target header value being representative of the target header;
    encoding means, coupled to the target means, for adding redundant data to the target header value;
    first comparator means, coupled to the readback means and the target means, for computing a difference between the readback header value and the target header value, the first comparator means producing a header difference signal indicating a difference between the readback header value and the target header value, the first comparator means also including difference evaluation means for evaluating the header difference signal, the difference evaluation means producing a difference evaluation signal indicating a number of bytes by which the readback header value and the target header value differ;
    first syndrome generator means, coupled to the readback means and responsive to the readback header value, for generating a first error syndrome based on the readback header value;
    second syndrome generator means, coupled to the first comparator means and responsive to the header difference signal, for generating a second error syndrome based on the header difference signal; and
    syndrome comparator means, responsive to the first syndrome generator means, the second syndrome generator means, and the difference evaluation signal, for producing a header mismatch signal that indicates a match if the first error syndrome and the second error syndrome are identical and if the difference evaluation signal indicates a number of bytes within a maximum allowable number of bytes, the header mismatch signal indicating a mismatch if it is not true that the first error syndrome and the second error syndrome are identical and the number of bytes is within the maximum allowable number of bytes.

5. A disc drive system, comprising:
    a magnetic disc for storing information in the form of header fields and data fields, each header field identifying a location of a corresponding data field;
    a read/write circuit located relative to the magnetic disc for reading information from and writing information to the magnetic disc;
    control means responsive to a host computer and the read/write circuit for controlling the read/write circuit to read a header field and access the corresponding data field;
    header field identification means, responsive to the host computer, the read/write circuit, and the control means, for identifying a target header field read from the disc by the read/write circuitry, the header field identification means comprising:
    readback means for receiving a readback reader value representing a header field read from the disc by the read/write circuit;
    target means for receiving a target header value from a host computer, the target header value being representative of the target header;
    encoding means, coupled to the target means, for adding redundant data to the target header value;
    first comparator means, coupled to the readback means and the target means, for computing a difference between the readback header value and the target header value, the first comparator means producing a header difference signal indicating a difference between the readback reader value and the target header value, the first comparator means also including difference evaluation means for evaluating the reader difference signal, the difference evaluation means producing a difference evaluation signal indicating a number of bytes by which the readback header value and the target header value differ;

first syndrome generator means, coupled to the readback means and responsive to the readback header value, for generating a first error syndrome based on the readback reader value;

second syndrome generator means, coupled to the first comparator means and responsive to the header difference signal, for generating a second error syndrome based on the header difference signal; and syndrome comparator means, responsive to the first syndrome generator means, the second syndrome generator means, and the difference evaluation signal, for producing a header mismatch signal that indicates a match if the first error syndrome and the second error syndrome are identical and if the difference evaluation signal indicates a number of bytes within a maximum allowable number of bytes, the header mismatch signal indicating a mismatch if it is not true that the first error syndrome and the second error syndrome are identical and the number of bytes is within the maximum allowable number of bytes.

6. A method of identifying a header field in a magnetic disc drive system having a magnetic disc with information stored in header fields and corresponding data fields, the magnetic disc drive system being provided for coupling to a host computer, the method comprising:

receiving a target header value, representing a target header having a corresponding data field to be accessed, from the host computer;

receiving a readback header value representing a header field read back from the magnetic disc;

comparing the target header value and the readback header value to produce a header difference value;

evaluating the header difference value to determine if the target header value and the readback header value differ by more than a maximum allowable amount;

generating a first error syndrome based on the readback header value;

generating a second error syndrome based on the header difference value;

comparing the first error syndrome with the second error syndrome to determine whether the first error syndrome and the second error syndrome are identical; and if the first error syndrome and the second error syndrome are identical and if the target header value and the readback header value differ by an amount within the maximum allowable amount, directing the disc drive system to access a data field corresponding to the header field represented by the readback header value.

7. The method of claim 6 and further comprising:
directing the disc drive system to read a subsequent header field if it is not true that the first error syndrome and the second error syndrome are identical and the target header value and the readback header value differ by an amount greater than the allowable amount.

8. Header identification apparatus comprising:
a plurality of headers each comprising a different value encoded into a codeword according to a predetermined generator polynomial having roots;

ecc encoder means for generating a target codeword having a number of symbols and identical to a target header's codeword;

means for reading the target header's codeword to generate readback codeword having a number of symbols; and comparison means responsive to the reading means for comparing the target codeword to the readback codeword and for counting a number of symbols comprising the difference between the number of symbols of the target codeword and the readback codeword wherein the comparison means comprises:

means for generating a difference codeword corresponding to the difference between the target codeword and the readback codeword;

syndrome generator means for dividing the readback codeword and the difference codeword by the roots of said generator polynomial to generate respective syndromes corresponding to each root;

means responsive to the syndrome generator means for comparing the respective syndromes of the difference codeword and the readback codeword; and means for generating a non-target-header signal in response to any difference between the respective syndromes of the difference codeword and the readback codeword;

the comparison means including means for generating a non-target-header target-header signal when the difference exceeds a predetermined number corresponding to an error correction capacity of the generator polynomial.

9. A header identification apparatus for identifying one of a plurality of headers each comprising a different value encoded into a codeword according to a predetermined generator polynomial having roots, the header identification apparatus comprising:

encoder means for generating a target codeword identical to a target header's codeword;

reading means for reading the target header's codeword to obtain a readback codeword;

comparison means operably connected to the encoder means and to the reading means for comparing the target codeword to the readback codeword and generating a difference codeword;

syndrome generator means for obtaining respective syndromes of the readback codeword and the difference codeword; and means for generating a non-target-header signal in response to a difference between the respective syndromes of the difference codeword and the readback codeword.

* * * * *

UNITED STATES PATENT AND TRADEMARK OFFICE
CERTIFICATE OF CORRECTION

PATENT NO. : 5,381,424
DATED : January 10, 1995
INVENTOR(S) : Tsang

It is certified that error appears in the above-indentified patent and that said Letters Patent is hereby corrected as shown below:

Column 9, line 15, delete "tile" and insert --the--;

Column 10, line 47, delete "reader" and insert --header--;

Column 10, line 61, delete "reader" and insert --header--;

Column 10, line 64, delete "reader" and insert --header--;

Column 12, line 2, insert --maximum-- before "allowable"; and

Column 12, line 11, insert --a-- after "generate".

Signed and Sealed this

Sixteenth Day of May, 1995

*Attest:*

BRUCE LEHMAN

*Attesting Officer*     *Commissioner of Patents and Trademarks*